(12) United States Patent
Nakamura et al.

(10) Patent No.: US 6,752,645 B2
(45) Date of Patent: Jun. 22, 2004

(54) SEMICONDUCTOR DEVICE-SOCKET HAVING ROTATIONALLY MOVABLE HEAT SINKS

(75) Inventors: Yuji Nakamura, Tokyo (JP); Yuki Kudo, Tokyo (JP)

(73) Assignee: Yamaichi Electronics Co., Ltd., Tokyo (JP)

( * ) Notice: Subject to any disclaimer, the term of this patent is extended or adjusted under 35 U.S.C. 154(b) by 0 days.

(21) Appl. No.: 10/212,875

(22) Filed: Aug. 7, 2002

(65) Prior Publication Data

US 2003/0032322 A1 Feb. 13, 2003

(30) Foreign Application Priority Data

Aug. 8, 2001 (JP) ........................................ 2001-241318

(51) Int. Cl.[7] ........................ H01R 13/62; G01R 31/02; H05K 7/20
(52) U.S. Cl. ........................ 439/330; 439/331; 324/755; 361/704
(58) Field of Search ................................ 439/330, 331; 324/755, 758; 361/704, 710

(56) References Cited

U.S. PATENT DOCUMENTS

| 5,482,471 A | * | 1/1996 | Mori et al. | 439/263 |
| 5,518,410 A | * | 5/1996 | Masami | 439/71 |
| 5,923,179 A | * | 7/1999 | Taylor | 324/755 |
| 6,155,859 A | * | 12/2000 | Choy | 439/331 |
| 6,243,267 B1 | * | 6/2001 | Chuang | 361/704 |
| 6,280,222 B1 | * | 8/2001 | Walkup | 439/331 |

FOREIGN PATENT DOCUMENTS

| JP | 11-097818 | 4/1999 |
| JP | 2001-013207 | 1/2001 |

* cited by examiner

*Primary Examiner*—Chandrika Prasad
(74) *Attorney, Agent, or Firm*—Finnegan, Henderson, Farabow, Garrett & Dunner, LLP (57) ABSTRACT

A semiconductor device socket having one or more heat sinks for dissipating heat from the object under test. The one or more heat sinks are held by arm members disposed in the semiconductor device socket for providing rotational movement about the object under test accommodation portion.

10 Claims, 11 Drawing Sheets

SEMICONDUCTOR DEVICE-SOCKET HAVING ROTATIONALLY MOVABLE HEAT SINKS

This application is based on Patent Application No. 2001-241318 filed Aug. 8, 2001 in Japan, the content of which is incorporated hereinto by reference.

BACKGROUND OF THE INVENTION

1. Field of the Invention

The present invention relates to a semiconductor device-socket used for testing the semiconductor device.

2. Description of the Related Art

Semiconductor devices to be mounted to an electronic equipment or others are subjected to various tests prior to being mounted so that latent defects thereof are removed. Such tests are carried out in a non-destructive manner by the application of voltage stress in correspondence to thermal and mechanical environmental tests, the high-temperature operation or the high-temperature stock. Of the above-mentioned various tests, it has been said that a burn-in test is effective for removing integrated circuits having infant mortality failures, in which a performance test is carried out under a high-temperature condition for a predetermined period.

A semiconductor device-socket used for such a test is disclosed, for example, in Japanese Patent Application Laying-open No. 2001-013207, wherein the socket is disposed on a printed circuit board having an input/output section for supplying a predetermined test voltage to the semiconductor device to be tested and issuing an abnormality detection signal generated therefrom, representing a short-circuit accident or others. The semiconductor device-socket is fixed on the printed circuit board and includes a socket body secured on the printed circuit board, the socket body having an accommodation portion for positioning and holding a semiconductor element, for example, of a BGA (ball grid array) type as the semiconductor device.

In the above structure, the burn-in test is carried out on the semiconductor device by supplying a predetermined testing signal to the printed circuit board.

During this test, a semiconductor device has been initiated in which heat generated in the semiconductor element due to the test signal is moved away from the semiconductor element to the printed circuit board and the socket body or into the atmosphere, for example, through ventilation holes. Or, there is a proposal in Japanese Patent Application Laying-open No. 11-097818 (1999) in that, for dissipating heat generated from the semiconductor element to the printed circuit board, a heat-conductive part effective for conducting such heat to the printed circuit board is provided on the printed circuit board.

However, in a case of a semiconductor element used for a central processing unit (CPU) generating a relatively large heat value, for example, there might be a risk in that the heat generated during the test is not sufficiently dissipated through the printed circuit board to not provide cooling for the semiconductor element itself.

SUMMARY OF THE INVENTION

In view of the above problems, an object of the present invention is to provide a semiconductor device-socket used for testing a semiconductor device capable of effectively dissipating heat generated in the semiconductor device to provide cooling for the semiconductor device during the test.

To achieve the above object, a semiconductor device-socket is provided, comprising a socket body having an accommodation portion for accommodating a semiconductor device and electrically connected to an input/output substrate for inputting/outputting a test signal relative to terminals of the semiconductor device accommodated in the accommodation portion; a radiating member held by arm members providing rotational movement in the circumference of the accommodation portion, for removing heat from the semiconductor device; and an arm member rotational movement mechanism provided in the socket body, for moving rotationally the arm members in one direction so that the radiating member is brought into contact with the surface of the semiconductor device accommodated in the accommodation portion and rotating the arm members in the other direction so that the radiating member is separated from the surface of the semiconductor device.

As apparent from the above description, since the radiating member for dissipating heat from the semiconductor device is held by the arm members providing rotational movement about the accommodation portion, it is possible to effectively remove heat generated in the semiconductor device to provide cooling for the semiconductor device during the test.

The above and other objects, effects, features and advantages of the present invention will become more apparent from the following description of embodiments thereof taken in conjunction with the accompanying drawings.

DETAILED DESCRIPTION OF PREFERRED EMBODIMENTS

Figure 1:
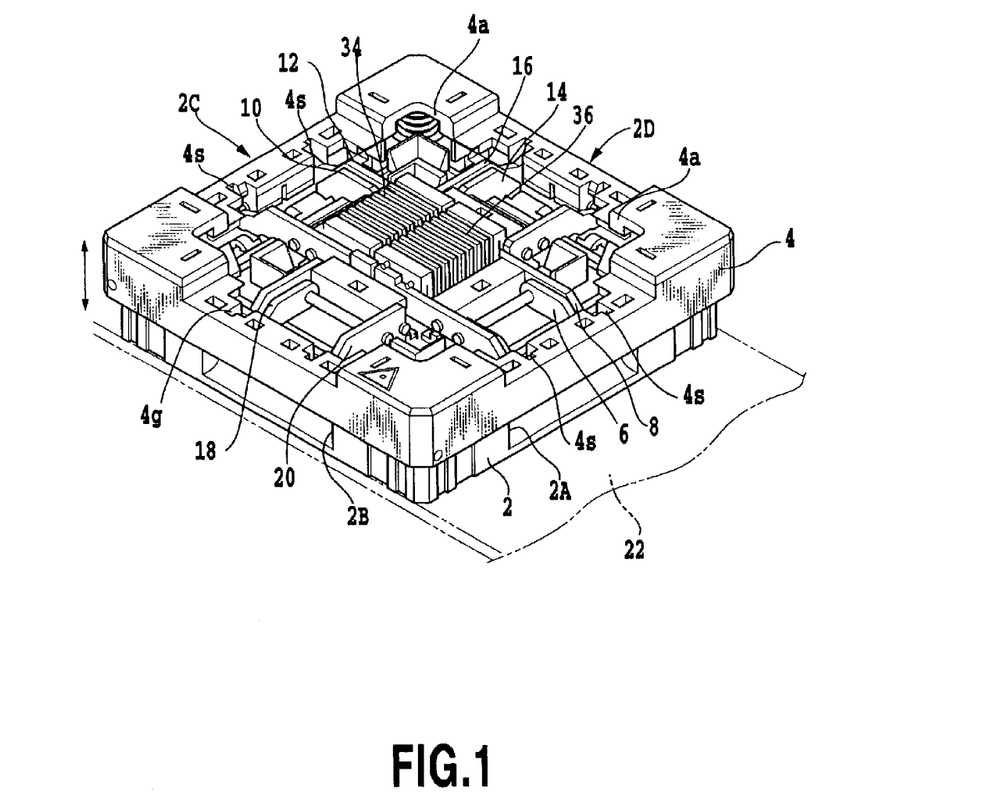
FIG. 1 is a perspective view of a first embodiment of a semiconductor device-socket according to the present invention, illustrating an appearance thereof.

FIG. 1 is a perspective view of a first embodiment of a semiconductor device-socket according to the present invention, illustrating an appearance thereof;

In FIG. 1, a plurality of semiconductor device-sockets are arranged at predetermined positions, for example, on a printed circuit board 22 in every directions. The semiconductor device-socket includes a socket body 2 having an accommodation portion for holding a semiconductor element to be tested (hereinafter referred to as an object under test), a frame member 4 movable upward and downward relative to the socket body 2, heat sinks 34 and 36 as a heat-sink member for exoergic cooling the tested object, disposed in the accommodation portion, and pressing members 38, 40 (see FIG. 2) for pressing a terminal section of the object under test disposed in the accommodation portion onto contact pins electrically connected to the electrodes of the printed circuit board 22.

In the printed circuit board 22, a group of electrodes is provided in correspondence to the respective socket body 2. The respective electrode group is electrically connected to a signal input/output section of the printed circuit board 22 for inputting and outputting the test signal through an electroconductive layer not shown.

Figure 2:
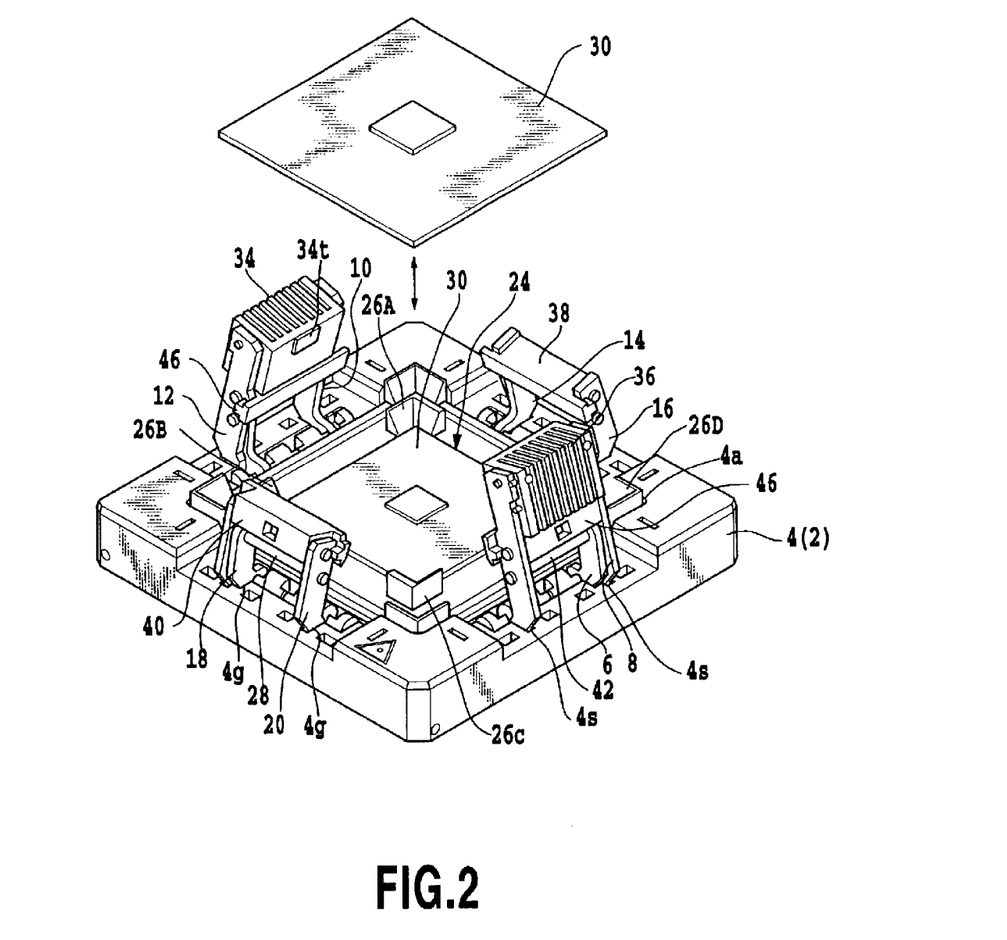
FIG. 2 is a perspective view made available for the operation of the embodiment shown in FIG. 1.

The socket body 2 molded in a resin has an object under test accommodation portion 24 for accommodating the tested object approximately in a central area thereof as shown in FIG. 2. The tested object accommodation portion 24 has, for example, a generally square recess. At four corners of walls defining the recess, positioning members 26A, 26B, 26C and 26D are provided for locating connecting terminal of the object under test 30 relatively to contact pins. Each of the positioning members 26A, 26B, 26C and 26D has a notch engageable with each of the four corners of a wiring substrate section of the object under test 30.

The object under test 30 is, for example, a so-called semi-finished product prior to being packaged, which includes a semiconductor element having internal electronic circuits and a circuit board section electrically connected to the semiconductor element. The wiring substrate section has the above-mentioned group of connection terminals on a surface opposed to the group of contact pins.

Also, as shown in FIG. 1, support sections 2B and 2D are provided in which one end of an arm member 14, 18 described later is supported in a rotational movably manner at two places around each of a pair of opposite edges in the other side of the object under test accommodation portion 24.

The one end of the arm member 14, 18 is coupled to the inner side of a front end portion of a pressing member supports 16, 20 by means of a connecting pin 28.

A pressing body 38, 40 is provided at a position of the pressing member support 16, 20 closer to the front end thereof than the front end portion to which the one end of the arm member 14, 18 is coupled. As shown in FIG. 1, when the frame member 4 occupies the uppermost position, a force of an resilient member for biasing the above-mentioned frame member 4 upward operates to the pressing member support 16, 20 via a predetermined transmitting member, so that the pressing member 38, 40 thereof touches to the wiring substrate portion of the object under test 30 at a predetermined pressure.

The frame member 4 encircling the upper area of the object under test accommodation portion 24 has an opening 4a at a center thereof, through which the object under test accommodation portion 24 or the object under test 30 is selectively passes, and as shown in FIGS. 1 and 2, is supported to be movable upward and downward relative to the socket body 2. FIG. 1 illustrate a state wherein the frame member 4 occupies the uppermost position, while FIG. 2 illustrates a state wherein the frame member 4 for covering the socket body 2 occupies the lowermost position.

Although not illustrated, a plurality of resilient members for biasing the frame member 4 upward are provided between the inner side of the frame member 4 and the socket body 2.

Further, grooves 4s to be engageable with heat sink holding members 8 and 12 described later and grooves 4g to be engageable with the pressing member supports 16 and 20 described later are formed on the periphery of the opening 4a of the frame member 4.

In the vicinity of the grooves 4s of the frame member 4, supporting portions for rotational movably supporting one end of the heat sink holding member 8 and 12 are provided. Also, in the vicinity of the grooves 4g of the frame member 4, supporting portions for rotational movably supporting one end of the pressing member supports 16 and 20 are provided. Each of these supporting portions has a support pin fitted in a hole of the one end of the heat sink holding member 8, 12 and a hole of the one end of the pressing member support 16, 20.

Support sections 2A and 2C are provided in which one end of an arm member 6, 10 described later is supported in a rotatable manner at two positions around each of the other pair of opposite edges in the object under test accommodation portion 24.

One ends of the arm members 6 and 10 are coupled to the inside of a front end portion of the heat sink holding members 8 and 12, respectively, with connecting pins 42.

Figure 4:
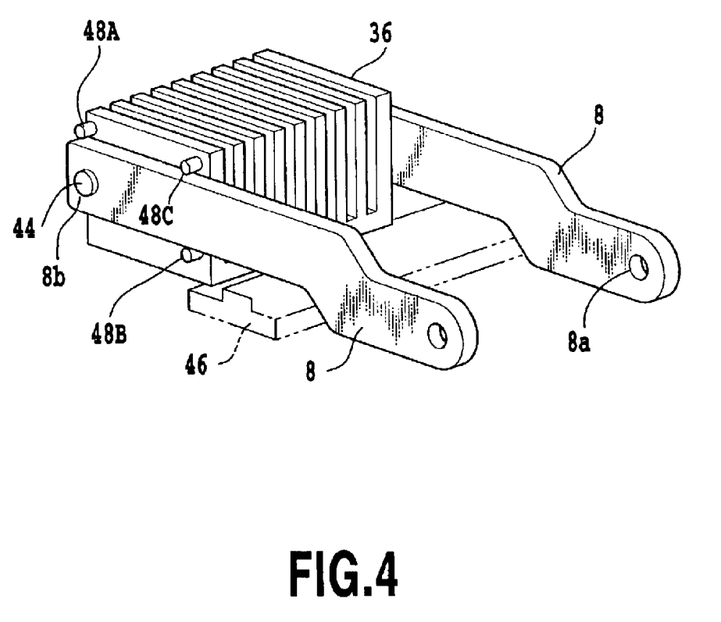
FIG. 4 is a perspective view of the structure for retaining a heat sink used in the embodiment shown in FIG. 1.

Since the structures for holding the heat sinks 36 and 34 by the heat sink holding members 8 and 12 are identical to each other, the holding structure for the heat sink 36 by the heat sink holding member 8 will be solely described as shown in FIG. 4 while eliminating the description of the heat sink holding member 12.

Each of the plank-type heat sink members 8 has at one end thereof a hole 8a to be fitted in an end portion of the support pin and at the other end thereof has a hole 8b to be fitted in an end portion of a support shaft 44 for supporting the heat sink 36. As shown in FIG. 1, between the respective pair of heat sink holding members 8, a pressing body 46 is nipped for pressing the wiring substrate of the object under test 30 when the heat sink holding members 8 approach the wiring substrate of the object under test 30. The opposite ends of the pressing body 46 are fastened to the heat sink holding members 8 by means of screws, respectively.

Figure 3:
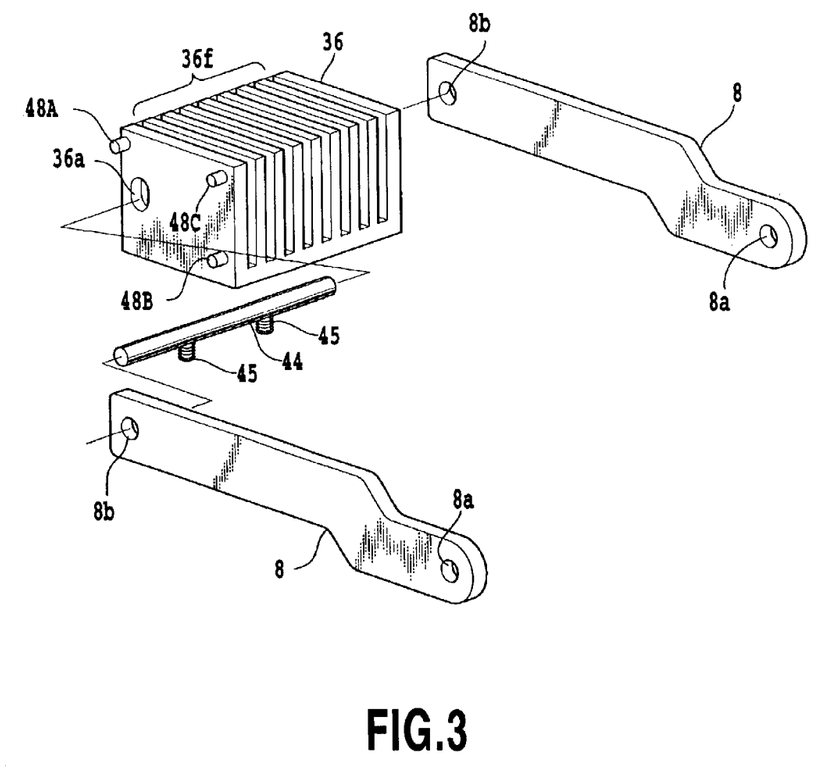
FIG. 3 is an exploded perspective view of a structure for retaining a heat sink used in the embodiment shown in FIG. 1.

As shown in FIG. 3, the heat sink 36 has a plurality of radiating fins 36f arranged at predetermined distance. The heat sink 36 also has an elongate hole 36a passing through the radiating fins 36f in the arrangement direction. The support shaft 44 is inserted into the elongate hole 36a. The opposite ends of the support shaft 44 are fixed to the holes 8b of the respective heat sink holding members 8. A plurality of coil springs 45 are provided between the outer periphery of the support shaft 44 and a bottom wall forming part of a slit defined between the radiating fins 36f of the heat sink 36, for biasing the heat sink 36 toward the side of the object under test 30. Accordingly, the heat sink 36 is rotational movably about the support shaft 44 biased by the elastic force of the coil spring 45. By varying the elastic force applied by the coil spring 45, the adhesion of a contact portion 36t of the heat sink 36 with the object under test 30 is adjustable.

On one side of the heat sink 36, positioning pins 48A and 48B are provided. The positioning pin 48A is disposed above the elongate hole 36a of the heat sink 36. On the other hand, the positioning pin 48B is disposed, as shown in FIG. 4, obliquely beneath the positioning pin 48A across the heat sink holding member 8 between the both at a predetermined gap. A positioning pin 48C is disposed opposite to the positioning pin 48B across the heat sink holding member 8 between the both at a predetermined gap.

Hereby, the rotation of the heat sink 36 relative to the respective heat sink holding members 8 is restricted by the positioning pins 48A, 48B and 48C.

Figure 6:
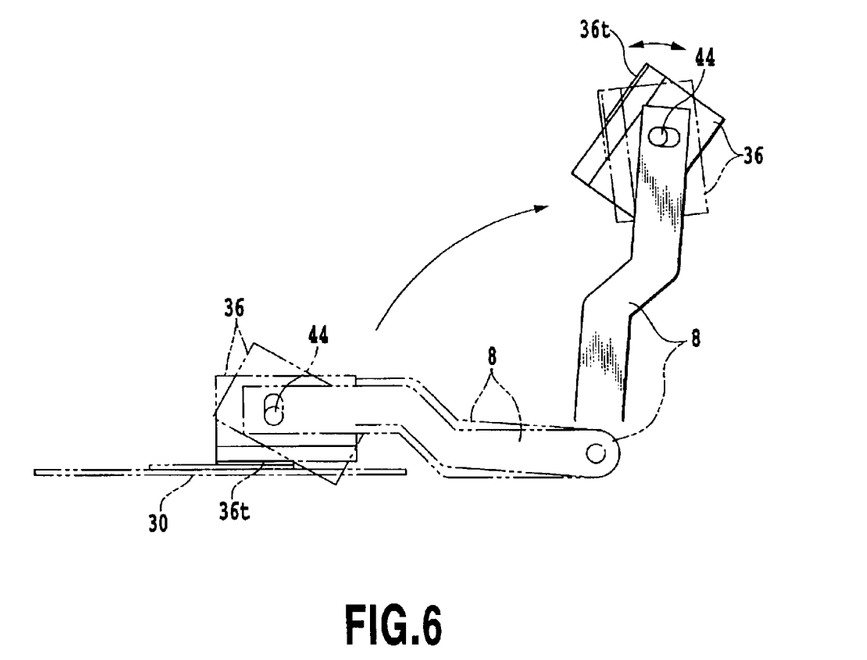
FIG. 6 is a view made available for illustrating the operation of a comparative example.

Suppose that there are no positioning pins 48A and 48B in the heat sink 36 as shown in FIG. 6, for example. When the heat sink 36 is abruptly separated from the object under test 30, the heat sink 36 is made to rotate about the support shaft 44 as shown by a solid line. Then, if the touching portion 36t of the heat sink 36 is again brought into contact with the object under test 30 as shown by a chain double-dashed line, the heat sink 36 may approach the respective heat sink holding members 8 as shown by a chain double-dashed line in a rotating state. As a result, there is a risk in that a corner of the end of the heat sink 36 may injure the surface of the object under test 30.

Contrarily, according to the first embodiment of the present invention, since the rotation of the heat sink 36 relative to the respective heat sink holding members 8 is restricted within a predetermined angular range by the contact of the outer circumference of the positioning pins 48A, 48B and 48C with the heat sink holding member 8, a risk is avoidable in that the surface of the object under test 30 is injured by the corner of the end of the heat sink 36.

In the above structure, upon mounting the object under test 30 onto the socket body 2, for example, by holding the object under test 30 by a robot hand not shown and accommodating the same in the object under test accommodation portion 24 through the opening 4a of the frame member 4, the frame member 4 is first lowered to a position shown in FIG. 2 against a bias of the resilient member by the robot hand not shown. In that case, since one end of the heat sink holding members 8 and 12 is moved downward together with the frame member 4, the arm members 6 and 10 are made to move rotationaly. Thus, as shown in FIG. 2, the heat sinks 34 and 36 are separated from the object under test accommodation portion 24 and in a inverted state.

Since one end of the pressing member supports 16 and 20 is also moved down together with the frame member 4, the arm members 14 and 16 are made to move rotationaly. Accordingly, as shown in FIG. 2, the presser bodies 38 and 40 are separated from the object under test accommodation portion 24 and in a inverted state.

Next, the object under test 30 is positioned by resting on the positioning members 26A, 26B, 26C and 26D in the bottom of the object under test accommodation portion 24, whereby the connection terminal section of the object under test 30 is located relative to a group of contact pins (not illustrated).

Figure 5:
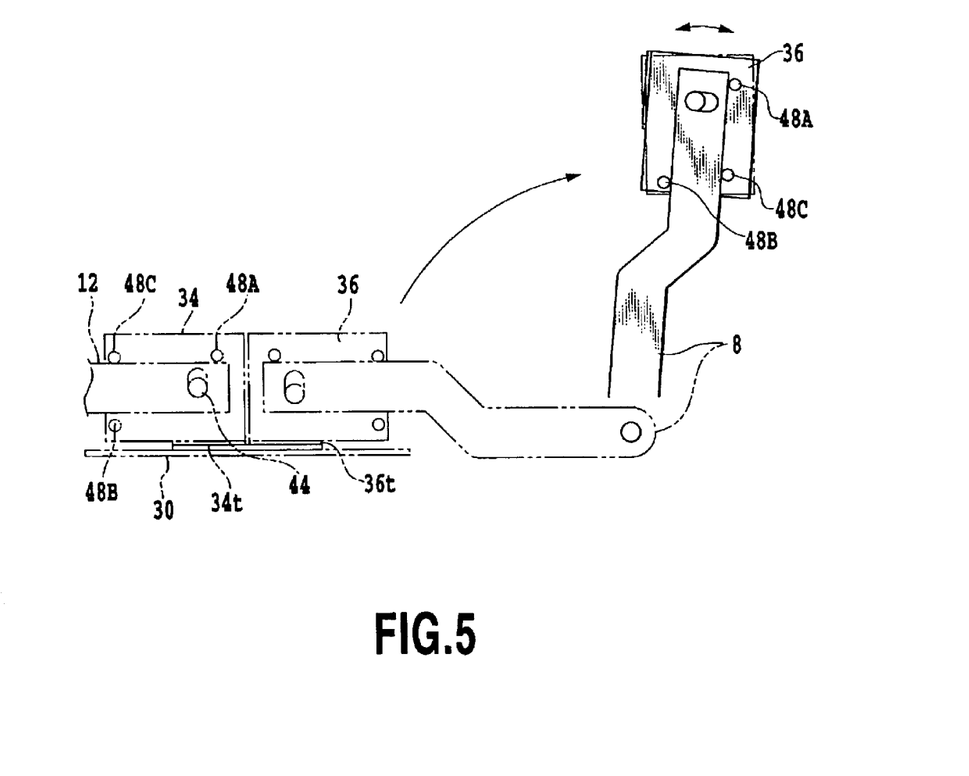
FIG. 5 is a view made available for illustrating the operation of the heat sink of the embodiment shown in FIG. 1.

When the frame member 4 is moved upward by the robot hand not shown and suspended at a position shown in FIG. 1, the wiring substrate of the object under test 30 is pressed toward the contact pins by the pressing bodies 38, 40 and 46. Also, as shown in FIG. 5, the touching portions 34t and 36t of the heat sinks 34 and 36 are solely brought into contact with the outer surface of the semiconductor element which is the object under test 30. In that case, as described above, since the relative rotation of the heat sinks 34 and 36 is restricted within a predetermined range, there is no risk in that the object under test 30 is injured by the corners of the heat sinks 34 and 36 when the both approach each other.

Thereafter, a predetermined test signal is issued in a predetermined atmosphere to the object under test 30 through the printed circuit board 22 and the group of contact pins, and the test is carried out on the object under test 30, during which heat generated in the object under test 30 is effectively dissipated through the heat sinks 34 and 36.

Further, when the object under test 30 is removed from the semiconductor socket after the completion of the test, the frame member 4 is again lowered by the robot hand not shown as described above, after which the object under test 30 finishing the test is removed from the object under test accommodation portion 24.

Figure 7:
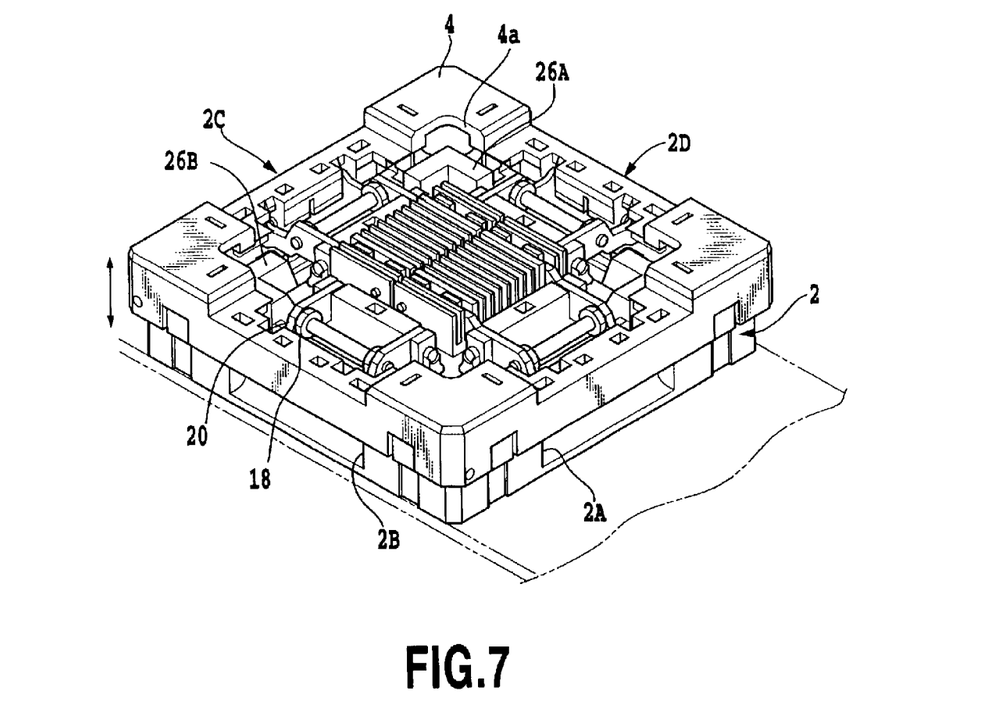
FIG. 7 is a perspective view of a second embodiment of a semiconductor device-socket according to the present invention, illustrating an appearance thereof.
Figure 8:
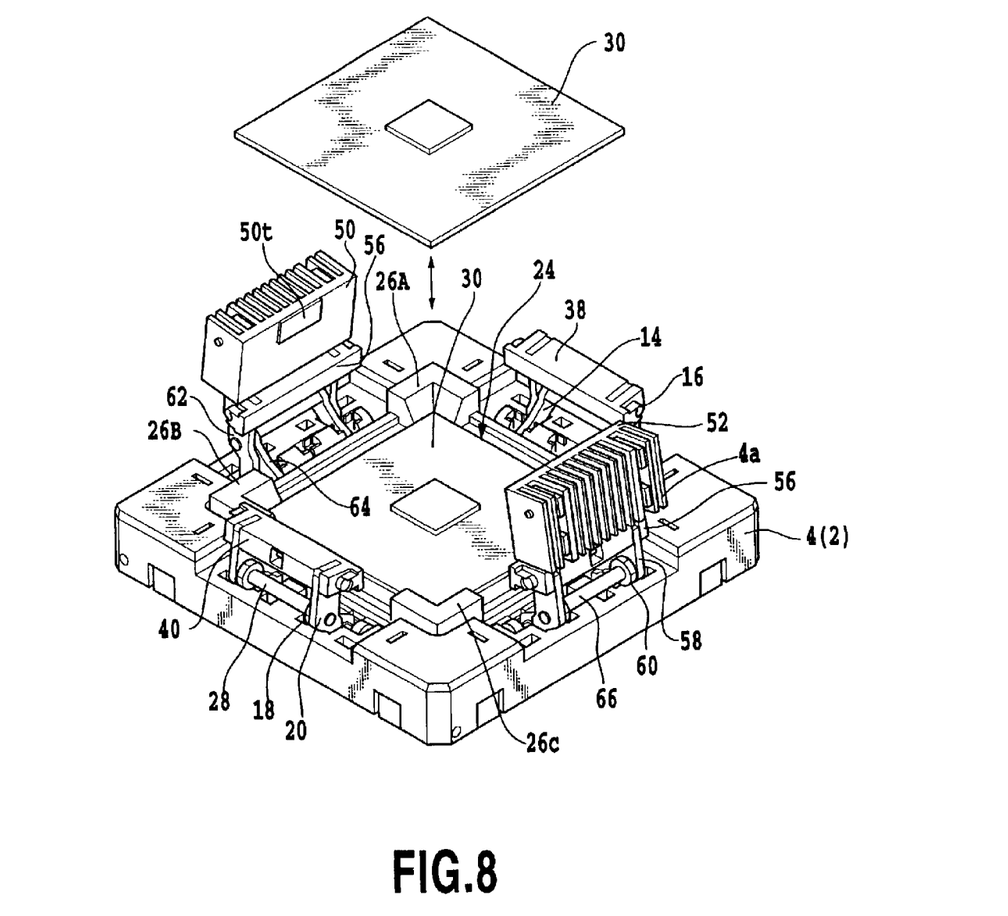
FIG. 8 is a perspective view made available for illustrating the operation of the embodiment shown in FIG. 7.

FIGS. 7 and 8 illustrate a second embodiment of a semiconductor socket according to the present invention, in which a object under test is mounted.

In this regard, in the embodiment shown in FIGS. 7 and 8, the same reference numerals are used for denoting the same or similar elements of the embodiment shown in FIGS. 1 and 2, and the explanation thereof will be eliminated for avoiding the duplication.

One ends of the arm members 64 and 66 supported in a rotational movably manner on the socket body 2 are coupled to the inside of front end portions of the heat sink holding members 58 and 62, respectively, by the connecting pins 66.

Figure 9:
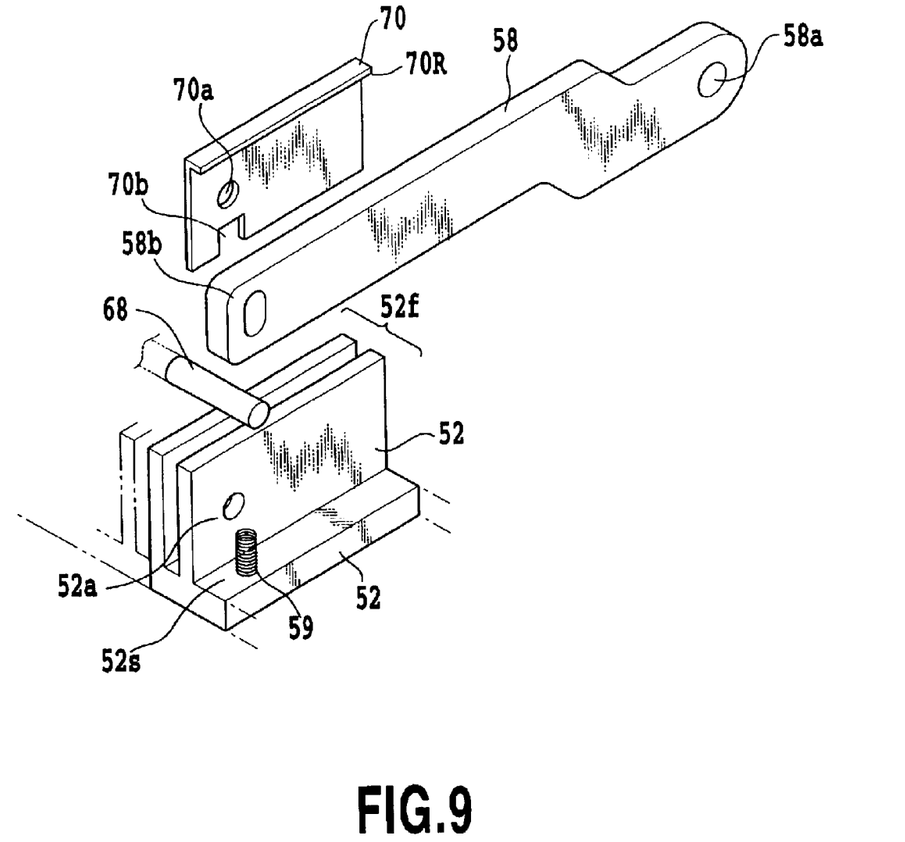
FIG. 9 is a perspective view of the structure for retaining a heat sink used in the embodiment shown in FIG. 7.
Figure 10:
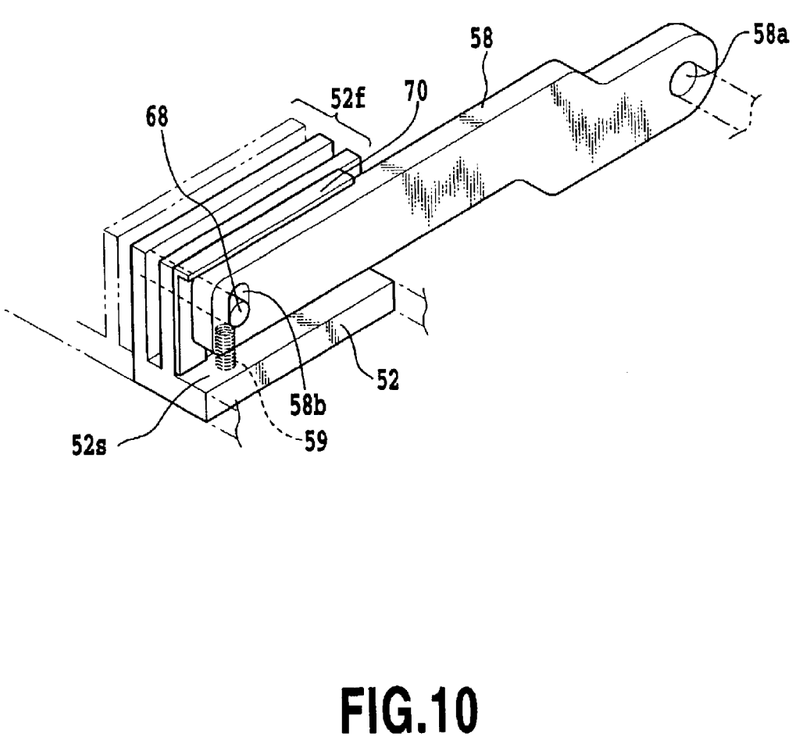
FIG. 10 is a partial perspective view of the structure for retaining a heat sink used in the embodiment shown in FIG. 7.

Since structures for holding the heat sinks 52 and 50 are identical to each other as shown in FIGS. 9 and 10, the explanation will be made solely on the structure for the heat sink 52 by the heat sink holding member 58 and that of the heat sink holding member 62 will be eliminated.

Each of the plank-type heat sink holding members 58 is provided at one end thereof with a hole 58a to be fitted into an end of the support pin, and at the other end thereof with an elongate hole 58b to be fitted into an end of the support shaft 68 for supporting the heat sink 52. As shown in FIG. 8, a pressing body 56 for pressing the wiring substrate of the object under test 30 while each of heat sink holding members 58 gets near the wiring substrate of the object under test 30 is nipped between the respective heat sink holding members 58. The opposite end portions of the pressing body 56 are fastened to the heat sink holding member 58, respectively. On the other hand, the pressing body 56 is also nipped between the respective heat sink holding members 62.

The heat sink 52 has a plurality of radiating fins 52f arranged at a predetermined distance as shown in FIGS. 9 and 10. The heat sink 52 has a hole 52a passing through the radiating fins 52f in the arrangement direction thereof. The support shaft 68 is inserted into the hole 52a. The opposite ends of the support shaft 68 are engaged with the elongate hole 58b of the respective heat sink holding members 58.

A coupling 52s is provided in each of two portions of the heat sink 52, into which one end of the respective heat sink holding member 58 is inserted and coupled. The coupling 52s is provided in correspondence to the distance between the respective heat sink holding members 58.

A positioning regulation plate 70 and an end of the heat sink holding member 58 are inserted in an overlapped state into the coupling 52s. Between the outer circumference of the support shaft 68 and the bottom of the coupling 52s, a coil spring 59 is disposed for biasing the touching portion of the heat sink 52 to the object under test. Accordingly, the heat sink 52 is rotational movably about the support shaft 68 biased by the elastic force of the coil spring 59. Also, by varying the bias of the coil spring 59, the adhesion of an touching portion of the heat sink 52 with the object under test is adjustable.

The positioning regulation plate 70 has a through-hole 70a at a position corresponding to the elongate hole 58a in the respective heat sink holding member 58 and the hole 52a of the heat sink 52. Also, below the through-hole 70a, a notch 70b is formed. The positioning regulation plate 70 has a step 70R at a longer side end thereof, engageable with an end of the heat sink holding member 58.

Hereby, the relative rotation of the heat sink 52 relative to the respective heat sink holding member 58 is restricted by the engagement of the step 70R of the positioning plate 70 with the end of the heat sink holding member 58.

Even in such a structure, in the same manner as in the above embodiment, after the frame member 4 has been lowered, the object under test 30 is placed and positioned on the positioning portions 26A, 26B, 26C and 26D in the object under test accommodation portion 24, whereby the connection terminal section of the object under test 30 is positioned to the group of contact pins (not shown).

Figure 11:
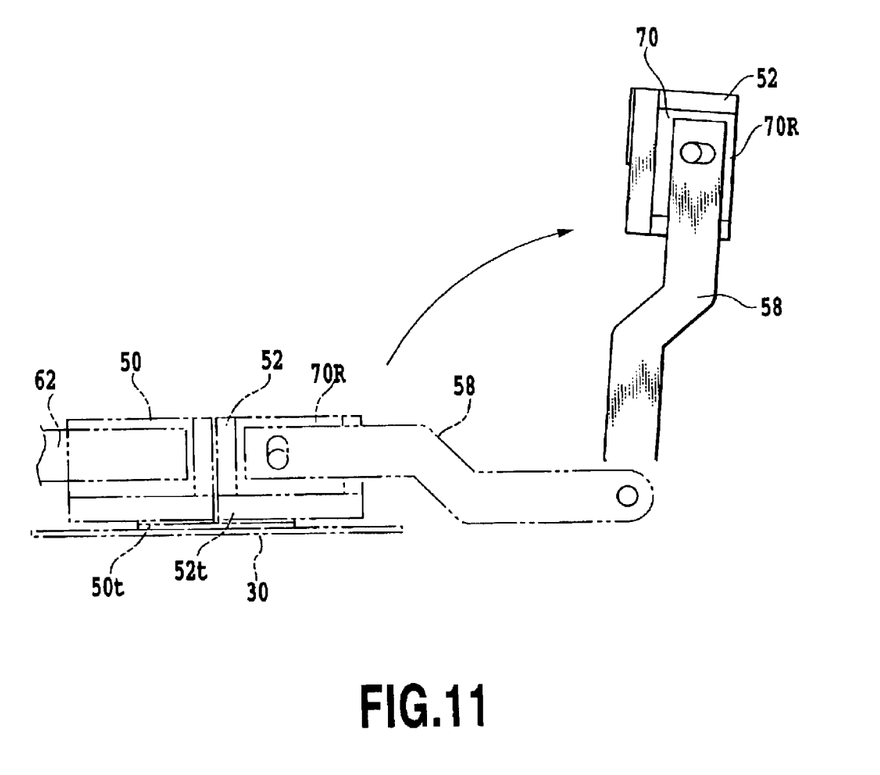
FIG. 11 is a view made available for illustrating the operation of the heat sink of the embodiment shown in FIG. 7.

Then, the frame member 4 is lifted by the robot hand not shown and suspended at a position shown in FIG. 7, at which the wiring substrate of the object under test 30 is pressed onto the contact pins by the presser bodies 38, 40 and 56. Also, as shown in FIG. 11, the touching portions 50t and 52t of the heat sinks 50 and 52 are solely brought into contact with the surface of the semiconductor element which is the object under test 30. In that case, as described above, since the relative rotation of the heat sinks 50 and 52 is restricted within a predetermined range, there is no risk in that the object under test 30 is injured by the corner of the heat sink 50 or 52.

Thereafter, a predetermined signal is issued to the object under test 30 through the printed circuit board 22 into the predetermined atmosphere and the group of contact pins, and the test is carried out on the object under test 30.

The present invention has been described in detail with respect to preferred embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. A semiconductor device-socket comprising:
   a socket body having an accommodation portion for accommodating a semiconductor device and electrically connectable to an input/output substrate for inputting/outputting a test signal relative to a plurality of terminals of said semiconductor device;
   a frame member vertically movable in an upward position and a downward position relative to the socket body;
   a plurality of rotationally movable arm members disposed alone a perimeter of said accommodation portion;
   a plurality of radiating members for providing heat transfer away from the semiconductor device; wherein each radiating member is held by one of the arm members; and
   an arm member rotational movement mechanism, for rotationally moving each arm member in a first direction when the frame member is in the upward position so that said radiating member is able to contact a surface of said semiconductor device and rotationally moving each arm member in a second direction when the frame member is in the downward position so that said radiating member is able to separate from the surface of said semiconductor device.

2. The semiconductor device-socket of claim 1, wherein said radiating members are held by said arm members in a rotational movement manner so that the relative rotation of said radiating member relative to said arm members is restricted within a predetermined range by a positioning regulation member provided in said radiating member.

3. The semiconductor device-socket of claim 2, wherein said positioning regulation member is a plurality pin members selectively engageable with said arm members.

4. The semiconductor device-socket of claim 2, wherein said positioning regulation member is a plank-type member having a step selectively engageable with said arm members.

5. The semiconductor device-socket of claim 1, wherein said radiating member is a heat sink having a plurality of radiating fins.

6. The semiconductor device-socket of claim 1, wherein said radiating member is held rotational rotationally movable by said arm members via a support shaft and biased by a resilient member provided between the outer circumference of said support shaft and the inside of said radiating member in a predetermined direction.

7. The semiconductor device-socket of claim 1, further comprising one or more pressing bodies; wherein each pressing body is held by one of said arm members
   so that each pressing body is brought into contact with the surface of said semiconductor device in the first direction and separated from the surface of said semiconductor device in the second direction.

8. A semiconductor device-socket comprising:
   a socket body having an accommodation portion for accommodating a semiconductor device and electrically connected to an input/output substrate for inputting/outputting a test signal relative to terminals of said semiconductor device;
   a radiating member held by arm members providing rotational movement in the circumference of said accommodation portion, for removing heat from said semiconductor device; and
   an arm member rotational movement mechanism provided in said socket body, for rotationally moving said arm members in one direction so that said radiating member is brought into contact with the surface of said semiconductor device accommodated in said accommodation portion and rotationally moving said arm members in the other direction so that said radiating member is separated from the surface of said semiconductor device;
   wherein said radiating member is held by said arm members in a rotational movement manner so that the relative rotation of said radiating member relative to said arm members is restricted within a predetermined range by a positioning regulation member provided in said radiating member.

9. A semiconductor device-socket comprising:
   a socket body having an accommodation portion for accommodating a semiconductor device and electrically connected to an input/output substrate for inputting/outputting a test signal relative to terminals of said semiconductor device;
   a radiating member held by arm members providing rotational movement in the circumference of said accommodation portion, for removing heat from said semiconductor device;
   an arm member rotational movement mechanism provided in said socket body, for rotationally moving said arm members in one direction so that said radiating member is brought into contact with the surface of said semiconductor device accommodated in said accommodation portion and rotationally moving said arm members in the other direction so that said radiating member is separated from the surface of said semiconductor device; and wherein said radiating member is held by said arm members in a rotational movement manner so that the relative rotation of said radiating member relative to said arm members is restricted within a predetermined range by a positioning regulation member provided in said radiating member; and wherein said positioning regulation member is a plurality pin members selectively engageable with said arm members.

10. A semiconductor device-socket comprising:

a socket body having an accommodation portion for accommodating a semiconductor device and electrically connected to an input/output substrate for inputting/outputting a test signal relative to terminals of said semiconductor device;

a radiating member held by arm members providing rotational movement in the circumference of said accommodation portion, for removing heat from said semiconductor device;

an arm member rotational movement mechanism provided in said socket body, for rotationally moving said arm members in one direction so that said radiating member is brought into contact with the surface of said semiconductor device accommodated in said accommodation portion and rotationally moving said arm members in the other direction so that said radiating member is separated from the surface of said semiconductor device; and wherein said radiating member is held by said arm members in a rotational movement manner so that the relative rotation of said radiating member relative to said arm members is restricted within a predetermined range by a positioning regulation member provided in said radiating member; and wherein said positioning regulation member is a plank-type member having a step selectively engageable with said arm members.

* * * * *

UNITED STATES PATENT AND TRADEMARK OFFICE
CERTIFICATE OF CORRECTION

PATENT NO.     : 6,752,645 B2  
DATED          : June 22, 2004  
INVENTOR(S)    : Yuji Nakamura et al.

It is certified that error appears in the above-identified patent and that said Letters Patent is hereby corrected as shown below:

Column 7,  
Line 52, "alone" should read -- along -- and

Column 8,  
Line 16, "held rotational rotationally" should read -- held rotationally --.

Signed and Sealed this

Nineteenth Day of April, 2005

JON W. DUDAS  
*Director of the United States Patent and Trademark Office*